United States Patent
Dry et al.

(10) Patent No.: US 10,872,837 B2
(45) Date of Patent: Dec. 22, 2020

(54) AIR-CAVITY SEMICONDUCTOR PACKAGE WITH LOW COST HIGH THERMAL CARRIER

(71) Applicant: Qorvo US, Inc., Greensboro, NC (US)

(72) Inventors: Robert Charles Dry, Plano, TX (US); Christine Blair, Lewisville, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/406,724

(22) Filed: May 8, 2019

(65) Prior Publication Data

US 2020/0357716 A1   Nov. 12, 2020

(51) Int. Cl.
*H01L 23/367* (2006.01)
*H01L 23/04* (2006.01)
*H01L 23/498* (2006.01)

(52) U.S. Cl.
CPC .......... *H01L 23/3675* (2013.01); *H01L 23/04* (2013.01); *H01L 23/49827* (2013.01); *H01L 23/49838* (2013.01)

(58) Field of Classification Search
CPC ....... H05K 2201/10416; H05K 1/0204; H05K 2201/0347; H01L 23/04; H01L 23/055; H01L 2924/16152
See application file for complete search history.

(56) References Cited

U.S. PATENT DOCUMENTS

| | | | |
|---|---|---|---|
| 10,199,313 B2 | 2/2019 | Dry | |
| 2007/0090515 A1* | 4/2007 | Condie | H01L 24/49 257/704 |
| 2013/0256858 A1* | 10/2013 | Komposch | H01L 23/06 257/676 |
| 2015/0116947 A1* | 4/2015 | Landon, Jr. | H05K 1/0204 361/720 |
| 2017/0358524 A1* | 12/2017 | Dry | H01L 23/13 |
| 2018/0061730 A1* | 3/2018 | Anderson | H01L 23/3731 |
| 2018/0061744 A1* | 3/2018 | Railkar | H01L 21/563 |

* cited by examiner

*Primary Examiner* — Alia Sabur
(74) *Attorney, Agent, or Firm* — Withrow & Terranova, P.L.L.C.

(57) ABSTRACT

The present disclosure relates to an air-cavity semiconductor package, which includes a thermal carrier, a ring structure, a package lid, and at least one semiconductor device. The thermal carrier has a carrier body, a heat slug residing within the carrier body, a top coating layer formed over a top surface of the heat slug, and a bottom coating layer formed over a bottom surface of the heat slug. The ring structure includes a ring body with an interior opening, which resides over the thermal carrier, such that a portion of a top surface of the thermal carrier is exposed through the interior opening. The package lid resides over the ring structure and has a recess conjoined with the interior opening forming an enclosed cavity. The at least one semiconductor device is attached to the exposed portion of the top surface of the thermal carrier and encapsulated in the enclosed cavity.

21 Claims, 6 Drawing Sheets

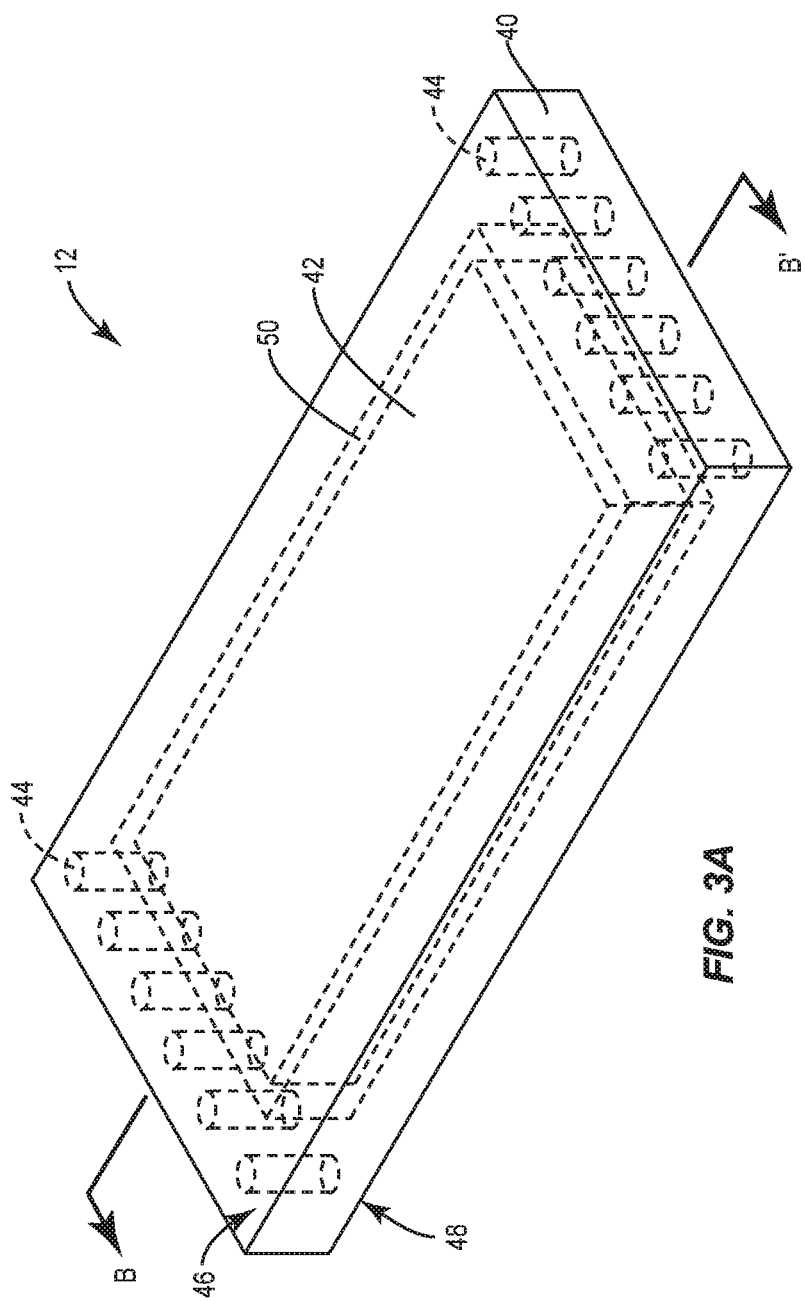
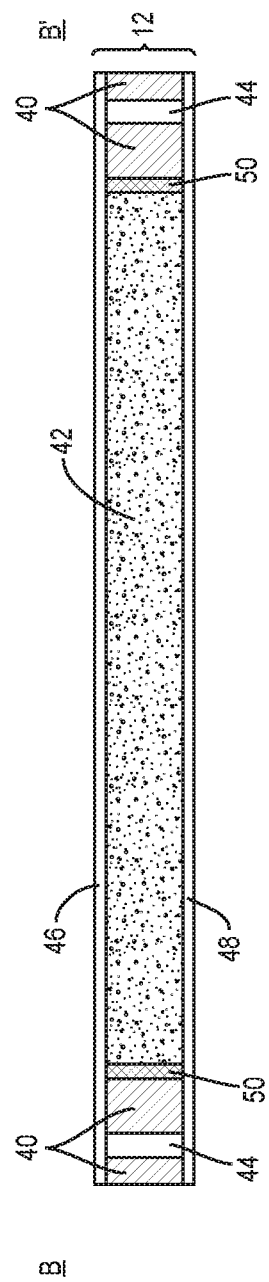
FIG. 3A
FIG. 3B

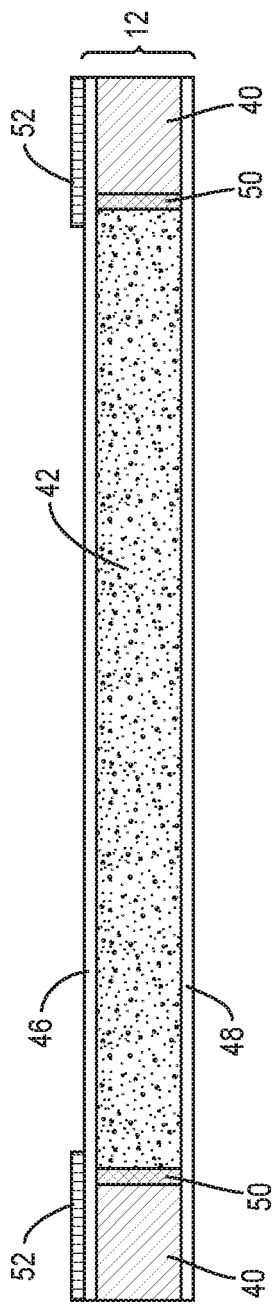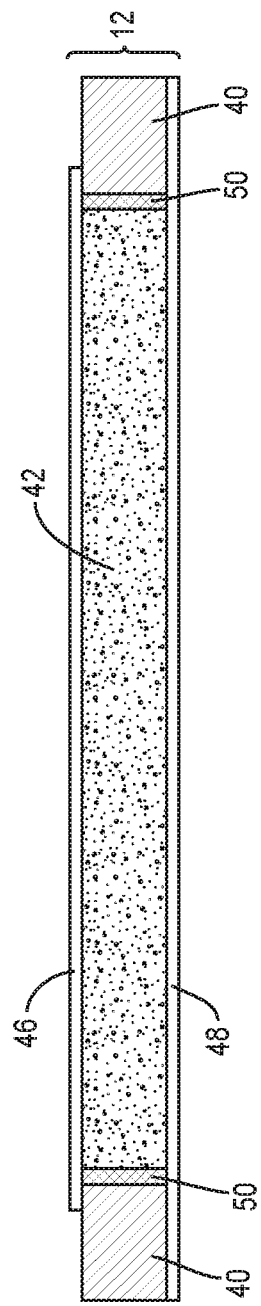
FIG. 4A
FIG. 4B

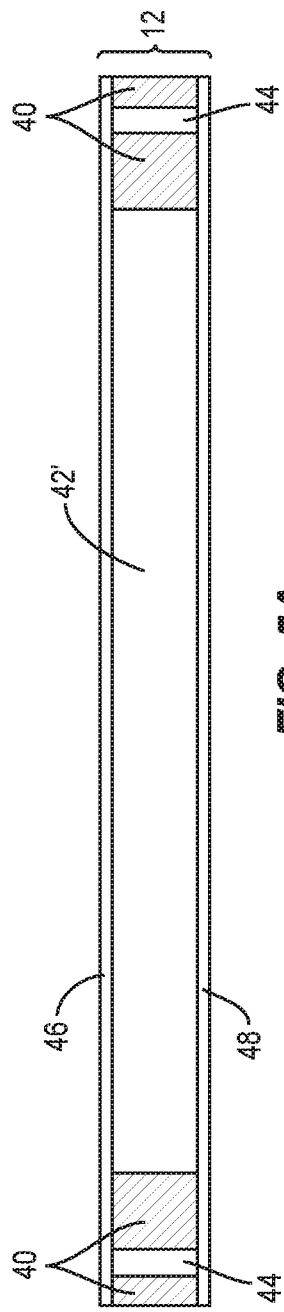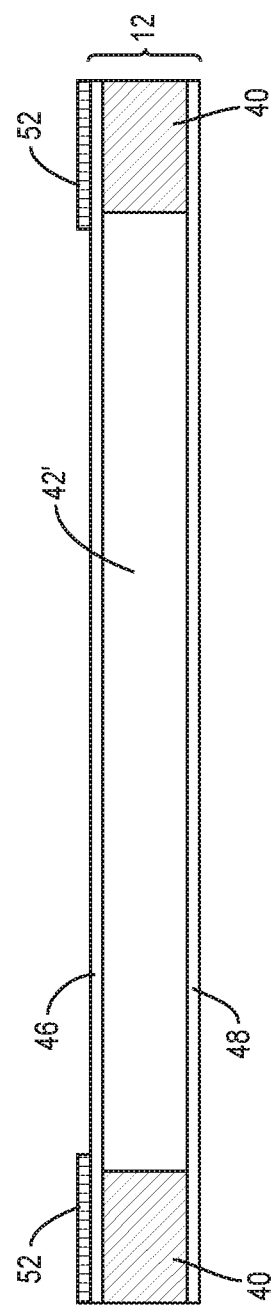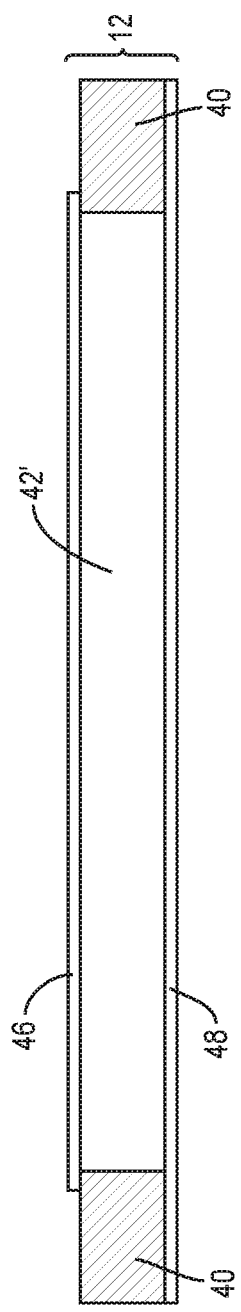

AIR-CAVITY SEMICONDUCTOR PACKAGE WITH LOW COST HIGH THERMAL CARRIER

FIELD OF THE DISCLOSURE

The present disclosure relates to a package for semiconductor devices and specifically to an air-cavity semiconductor package with a low cost high thermal carrier for semiconductor devices.

BACKGROUND

As semiconductor devices become more pervasive in consumer and commercial grade products, packages employed to encase these semiconductor devices become more important. Traditional packages commonly include a mixture of ceramic and metal technologies that are assembled together using high-temperature brazing processes. Notably, a package may be designed to meet the requirements of the corresponding semiconductor devices that the package encases. Thus, packages may be adapted to support particular power and frequency thresholds.

However, packages adapted to support higher power and higher frequency devices, such as those used in commercial and military applications, incur higher design and fabrication costs. Further, demand for packages designed to support such higher power and higher frequency semiconductor devices continues to grow. Therefore, it would be advantageous to employ a packaging solution for semiconductor devices that is capable of supporting higher power and higher frequency semiconductor devices at a reduced cost.

SUMMARY

The present disclosure relates to an air-cavity semiconductor package, which includes a thermal carrier, a ring structure, a package lid, and at least one semiconductor device. The thermal carrier has a carrier body, a heat slug, a top coating layer, and a bottom coating layer. Herein, the heat slug resides in the carrier body and is surrounded by the carrier body. The top coating layer is formed over a top surface of the heat slug, and the bottom coating layer is formed underneath a bottom surface of the carrier body and a bottom surface of the heat slug. The ring structure includes a ring body that resides on a top surface of the thermal carrier and has an interior opening, such that a portion of the top surface of the thermal carrier is exposed through the interior opening of the ring body. The heat slug within the thermal carrier is aligned vertically with the interior opening of the ring body. The package lid resides over the ring structure and has a recess conjoined with the interior opening of the ring body to form an enclosed cavity. The at least one semiconductor device is attached to the exposed portion of the top surface of the thermal carrier and encapsulated in the enclosed cavity.

In one embodiment of the air-cavity semiconductor package, the heat slug, the top coating layer, and the bottom coating layer are formed of copper. Herein, the heat slug is in contact with interior surfaces of the carrier body.

In one embodiment of the air-cavity semiconductor package, the heat slug is formed of sandwiched copper-molybdenum-copper laminates, and the top coating layer and the bottom coating layer are formed of copper. Herein, the heat slug is coupled to interior surfaces of the carrier body via a glue material.

In one embodiment of the air-cavity semiconductor package, the top coating layer has a density between 0.5 oz/$\mu m^2$ and 2 oz/$\mu m^2$, and the bottom coating layer has a density between 0.5 oz/$\mu m^2$ and 2 oz/$\mu m^2$.

In one embodiment of the air-cavity semiconductor package, the carrier body and ring body are formed from a same organic laminate material.

In one embodiment of the air-cavity semiconductor package, the carrier body and ring body are formed from different organic laminate materials.

In one embodiment of the air-cavity semiconductor package, a top surface of the carrier body and the top surface of the heat slug are in a common top plane, while the bottom surface of the carrier body and the bottom surface of the heat slug are in a common bottom plane. The top coating layer fully covers the top surface of the carrier body and the top surface of the heat slug, and the bottom coating layer fully covers the bottom surface of the carrier body and the bottom surface of the heat slug.

In one embodiment of the air-cavity semiconductor package, the thermal carrier further includes a number of carrier vias. Each carrier via extends vertically through the carrier body and is electrically coupled to both the top coating layer and the bottom coating layer.

In one embodiment of the air-cavity semiconductor package, the carrier vias reside at opposite sides of the heat slug.

In one embodiment of the air-cavity semiconductor package, the carrier vias surround the heat slug.

In one embodiment of the air-cavity semiconductor package, a bottom surface of the ring body is coupled to the top coating layer.

In one embodiment of the air-cavity semiconductor package, the thermal carrier further includes a solder mask over a periphery of the top coating layer, wherein a bottom surface of the ring body is coupled to the solder mask.

In one embodiment of the air-cavity semiconductor package, a top surface of the carrier body and the top surface of the heat slug are in a common top plane, while the bottom surface of the carrier body and the bottom surface of the heat slug are in a common bottom plane. The bottom coating layer fully covers the bottom surface of the carrier body and the bottom surface of the heat slug. The top coating layer fully covers the top surface of the heat slug, and at least a portion of the top surface of the carrier body is not covered by the top coating layer, such that a bottom surface of the ring body is coupled to the exposed portion of the top surface of the carrier body.

In one embodiment of the air-cavity semiconductor package, the ring structure further includes a number of interconnect tabs and a number of contact layers. Herein, the interconnect tabs are separate from each other, and the contact layers are separate from each other. Each interconnect tab includes a tab body that extends outward from an outer periphery of the ring body and a plating layer that covers at least a portion of a top surface of the tab body and at least a portion of a bottom surface of the tab body. Herein, a portion of the plating layer over the top surface of the tab body and a portion of the plating layer over the bottom surface of the tab body are electrically coupled. The plating layer is connected to a corresponding contact layer and is separate from the thermal carrier. The package lid is coupled to the contact layers, and a portion of each contact layer is exposed to the enclosed cavity.

In one embodiment of the air-cavity semiconductor package, the ring body and the tab body are formed from a same organic laminate material.

In one embodiment of the air-cavity semiconductor package, the plating layer covers at least one side surface of the tab body.

In one embodiment of the air-cavity semiconductor package, each interconnect tab further includes a number of plated vias that electrically couple the portion of the plating layer over the top surface of the tab body and the portion of the plating layer over the bottom surface of the tab body.

In one embodiment of the air-cavity semiconductor package, the ring structure further includes a number of interconnect tabs and a number of contact layers. Herein, the interconnect tabs are separate from each other, and the contact layers are separate from each other. Each interconnect tab is formed of a solid conductive material and extends outward from an outer periphery of the ring body. Each interconnect tab is connected to a corresponding contact layer and is separate from the thermal carrier. The package lid is coupled to the contact layers and a portion of each contact layer is exposed to the enclosed cavity.

In one embodiment of the air-cavity semiconductor package, the thermal carrier has a thickness between 10 mil and 60 mil, and the ring structure has a thickness between 5 mil and 25 mil.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3A-3B show an exemplary thermal carrier with an embedded heat slug included in the air-cavity semiconductor package shown in FIG. 1A.

FIGS. 4A-4B show an alternative thermal carrier with an embedded heat slug.

FIGS. 5A-5C show an exemplary thermal carrier with a plated heat slug included in the air-cavity semiconductor package shown in FIG. 1A.

Figure 1A:
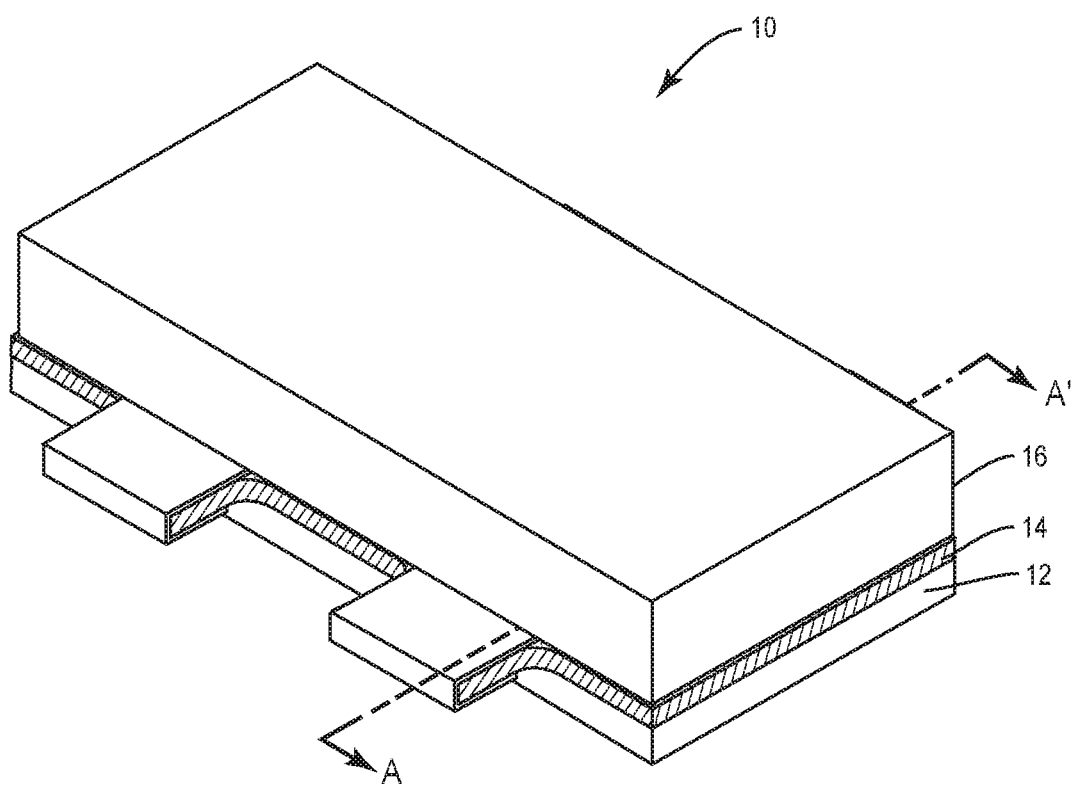
FIGS. 1A-1C show an exemplary air-cavity semiconductor package according to one embodiment of the present disclosure.

It will be understood that for clear illustrations, FIGS. 1A-5C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
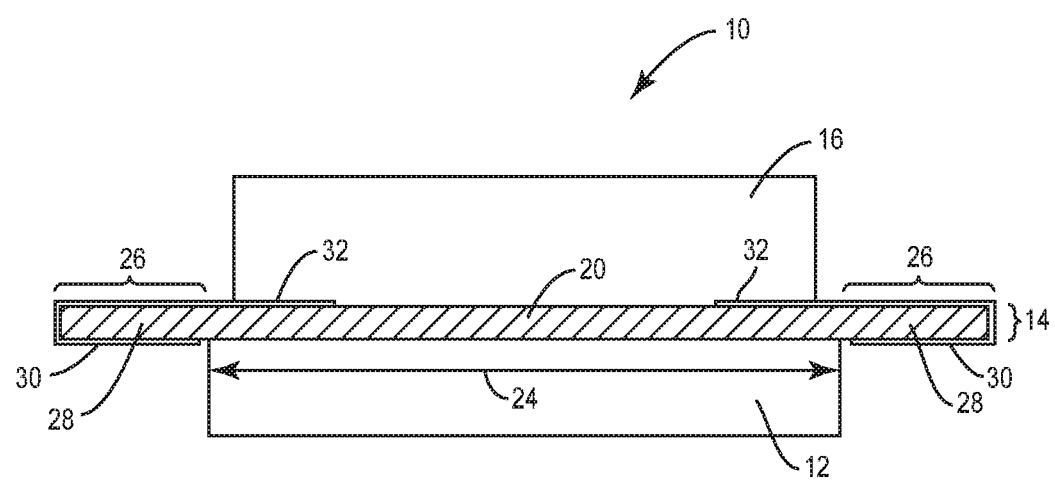
Figure 1C:
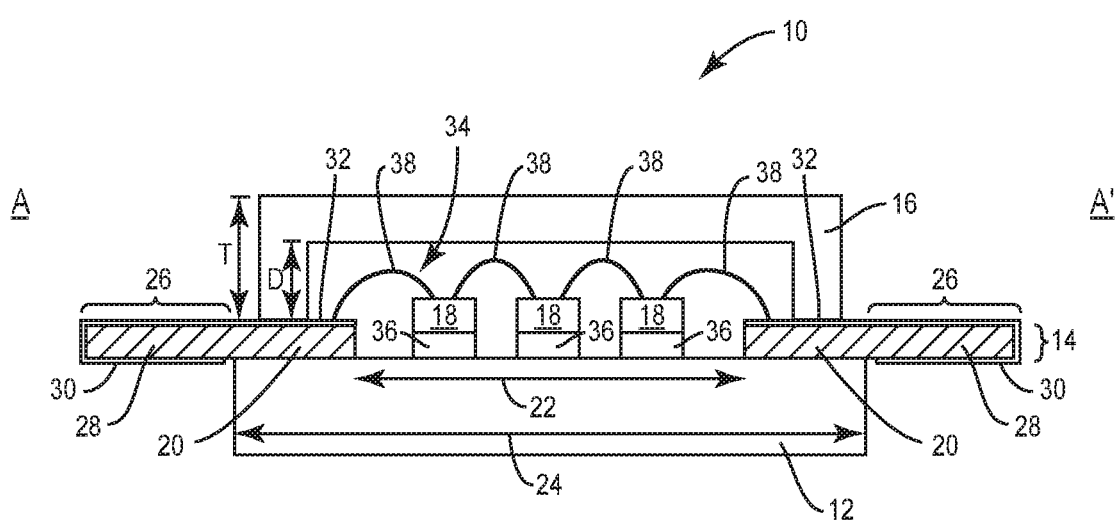
Figure 2:
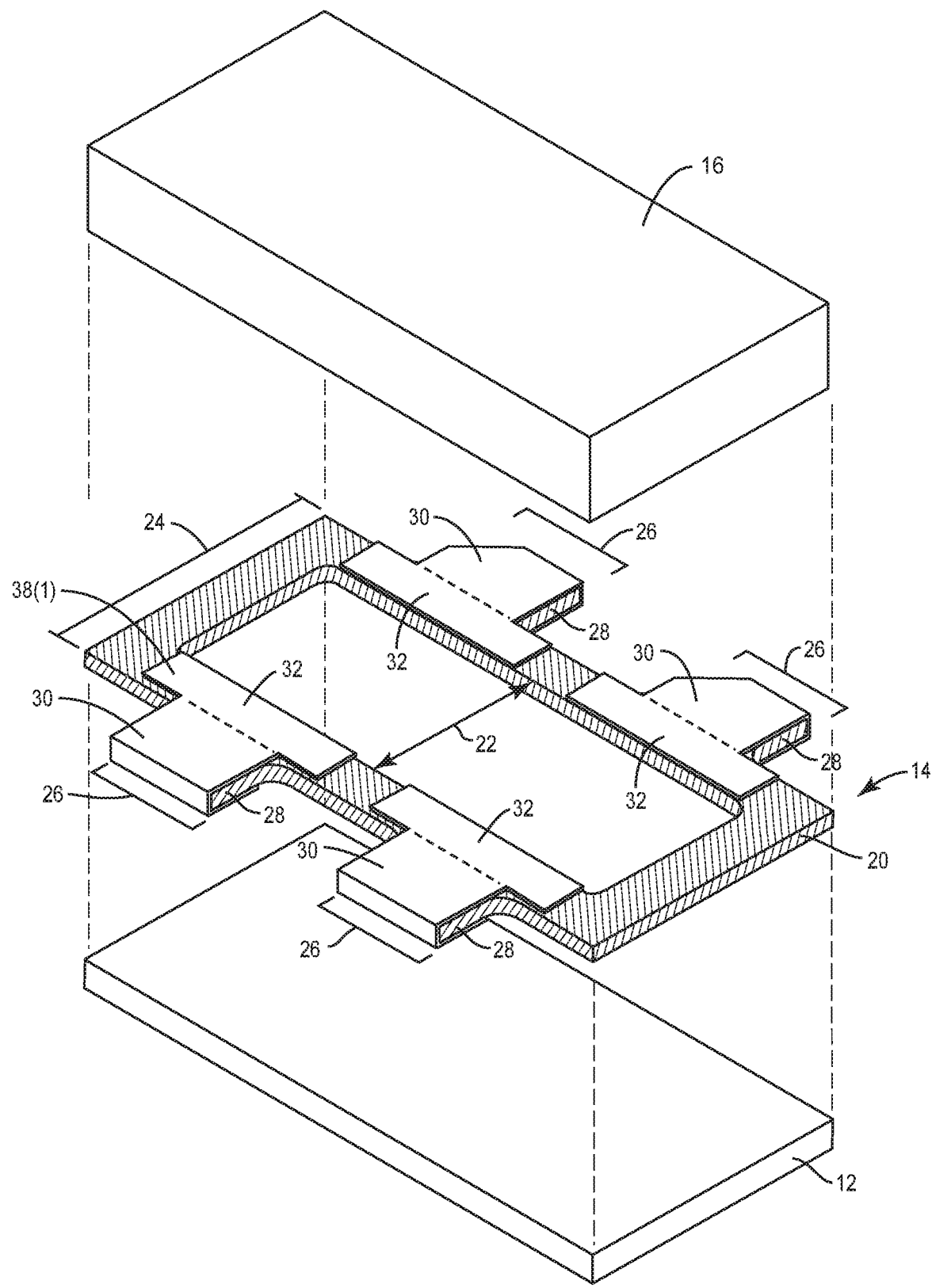
FIG. 2 is a diagram illustrating multiple layers of the air-cavity semiconductor package shown in FIG. 1A.

The present disclosure relates to an air-cavity semiconductor package with a low cost high thermal carrier for semiconductor devices. FIGS. 1A-1C provide top, side, and cross-section diagrams, respectively, of an exemplary air-cavity semiconductor package 10 according to one embodiment of the present disclosure. FIG. 2 provides a diagram illustrating multiple layers of the air-cavity semiconductor package 10 (without semiconductor devices for clarity). Notably, components of the air-cavity semiconductor package 10 are referred to with common element numbers in FIGS. 1A-1C and 2.

For the purpose of this illustration, the air-cavity semiconductor package 10 includes a thermal carrier 12, a ring structure 14, a package lid 16, and three semiconductor devices 18 (see FIG. 1C). In different applications, the air-cavity semiconductor package 10 may include fewer or more semiconductor devices 18. The ring structure 14 is over the thermal carrier 12, and the package lid 16 is over the ring structure 14. The thermal carrier 12 may have a thickness between 10 mil and 60 mil, and the ring structure 14 may have a thickness between 5 mil and 25 mil.

In detail, the ring structure 14 may include a ring body 20 with an interior opening 22 and an outer periphery 24, interconnect tabs 26 with tab bodies 28 and plating layers 30, and contact layers 32. Each interconnect tab 26 is separate from each other and includes one tab body 28 wrapped with a corresponding plating layer 30. In this manner, at least a portion of a top surface and at least a portion of a bottom surface of each tab body 28 are covered by the corresponding plating layer 30. In some applications, one or more side surfaces of each tab body 28 may be covered by the corresponding plating layer 30 as well. A portion of the plating layer 30 over the top surface of one tab body 28 and a portion of the plating layer 30 over the bottom surface of the same tab body 28 are always electrically coupled.

Herein, the tab body 28 of each interconnect tab 26 extends outward from the outer periphery 24 of the ring body 20. The ring body 20 and each tab body 28 may be formed from organic laminate materials, such as Isola 370HR FR4, Isola I-Terra FR4, Isola G200 GT resin based material, Rogers 4000 series materials (e.g., hydrocarbon/ceramic laminates), or the like. Notably, the ring body 20 and each tab body 28 in alternative embodiments may be formed as a solid structure rather than a laminate structure. In addition, each contact layer 32 is formed over a top surface of the ring body 20 and connects one plating layer 30 of a corresponding interconnect tab 26. The contact layers 32 are separate from each other. The plating layers 30 and the contact layers 32 may be formed concurrently from conductive materials, such as gold, silver, copper, and/or aluminum.

A bottom surface of the ring body 20 is coupled to a top surface of the thermal carrier 12, such that a portion of the top surface of the thermal carrier 12 is exposed through the interior opening 22 of the ring body 20. No portion or a small portion of each interconnect tab 26 may reside over the top surface of the thermal carrier 12. Note that each plating layer 30, which wraps around the tab body 28, is not in contact with the thermal carrier 12. There is a gap between each plating layer 30 (on the bottom surface of the tab body 28) and the thermal carrier 12.

In some applications, each interconnect tab 26 may further include a number of plated vias (not shown), which extend through the tab body 28 and are electrically coupled to the plating layer 30 on both top and bottom surfaces of the tab body 28 (details regarding the plated vias in this manner are discussed in U.S. Pat. No. 10,199,313, the contents of which are hereby incorporated by reference in their entirety). In some applications, there may be a spacer ring, which is not electrically conductive and may be formed from an organic laminate material (a same or different material as the ring body 20), sandwiched between the thermal carrier 12 and the ring structure 14 (details regarding the spacer ring in this manner are discussed in U.S. Pat. No. 10,199,313, the contents of which are hereby incorporated by reference in their entirety). In some applications, each interconnect tab 26 may be a solid conductive tab formed of a conductive material, such as copper or conductive epoxy (not shown), instead of the non-conductive tab body 28 with the plating layers 30. Herein, each interconnect tab 26 (solid conductive tab) extends outward from the outer periphery 24 of the ring body 20, is electrically coupled to a corresponding contact layer 32, and is still separate from the thermal carrier 12.

With particular reference to FIG. 1C, the package lid 16 includes a recess 34, which has a depth D that is less than a thickness T of the package lid 16. In other words, the recess 34 does not extend completely through the package lid 16. The thickness T of the package lid 16 may be between 1.2 mm and 2.4 mm, while the depth D of the recess 34 may be between 15% and 90% of the thickness T of the package lid 16. Additionally, the package lid 16 may be formed as a solid structure and from an organic material, such as Isola 370HR, Isola 300MD, or the like. In alternative embodiments, the package lid 16 may be formed from a polyimide material, such as, but not limited to, Isola P95. The package lid 16 resides over the ring structure 14, such that the recess 34 is in communication with the interior opening 22 of the ring body 20 to form an enclosed cavity. Side walls of the package lid 16 are coupled to the contact layers 32 formed over the top surface of the ring body 20, and a portion of each contact layer 32 is exposed to the enclosed cavity.

The semiconductor devices 18 are attached to the exposed portion of the top surface of the thermal carrier 12, such that the semiconductor devices 18 are surrounded by the ring structure 14 and encapsulated in the enclosed cavity. The semiconductor devices 18 may be connected to the top surface of the thermal carrier 12 by way of a connecting material 36, such as a eutectic solder or high thermal adhesive. Each semiconductor device 18 may be coupled to another semiconductor device 18 and/or the exposed portion of a corresponding contact layer 32 with bonding wires 38. Thus, the interconnect tabs 26 may be adapted to function as input ports and/or output ports of the semiconductor devices 18 (via the contact layers 32 and the bonding wires 38).

FIGS. 3A-3B provide perspective and cross-section details of the thermal carrier 12, respectively, which is included in the air-cavity semiconductor package 10 shown in FIG. 1A. The thermal carrier 12 includes a carrier body 40, a heat slug 42, a number of carrier vias 44 (only two carrier vias are labeled with reference numbers for clarity), a top coating layer 46, and a bottom coating layer 48. The heat slug 42 is embedded in the carrier body 40 and is surrounded by the carrier body 40. Note that the heat slug 42 is vertically aligned with the interior opening 22 within the ring structure 14 (not shown), such that the ring body 20 of the ring structure 14 substantially resides over the carrier body 40. Further, the semiconductor devices 18, which reside within the interior opening 22, are aligned above the heat slug 42. Consequently, the heat generated by the semiconductor devices 18 may dissipate efficiently.

A top surface of the carrier body 40 and a top surface of the heat slug 42 may be in a common top plane, while a bottom surface of the carrier body 40 and a bottom surface of the heat slug 42 may be in a common bottom plane. The top coating layer 46 is formed over the common top plane, fully covers the top surface of the carrier body 40 and the top surface of the heat slug 42, and is in contact with the carrier body 40 and the heat slug 42. The bottom coating layer 48 is formed underneath the common bottom plane, fully covers the bottom surface of the carrier body 40 and the bottom surface of the heat slug 42, and is in contact with the carrier body 40 and the heat slug 42. Each carrier via 44 extends vertically through the carrier body 40 and is electrically coupled to both the top coating layer 46 and the bottom coating layer 48. The carrier vias 44 may reside at opposite sides of the heat slug 42, or may surround the heat slug 42 within the carrier body 40.

Herein, the thermal carrier 12 may be adapted to function as a heat sink and a ground plane for the air-cavity semiconductor package 10. In this manner, the carrier body 40 may be formed from organic laminate materials, such as Isola 370HR FR4, Isola I-Terra FR4, Isola G200 BT resin based material, Rogers 4000 series materials (e.g., hydrocarbon/ceramic laminates), or the like. The heat slug 42 may be formed of sandwiched copper-molybdenum-copper laminates (Cu/Mo/Cu). In this manner, a glue material 50 may be used to fill gaps between the heat slug 42 and the carrier body 40 to enhance adhesion. The carrier vias 44, the top coating layer 46, and the bottom coating layer 48 may be formed of copper by plating. Herein, the top coating layer 46 may have a density between 0.5 oz/µm$^2$ and 2 oz/µm$^2$, and the bottom coating layer 48 may have a density between 0.5 oz/µm$^2$ and 2 oz/µm$^2$.

It is clear that the thermal carrier 12 formed from both organic laminate materials and metal materials will be less expensive than a solid metal carrier. In addition, the material(s) used for the carrier body 40 and the material(s) used for the ring body 20 may be essentially the same or have similar coefficient of thermal expansion (CTE). Since the ring body 20 of the ring structure 14 substantially resides over the carrier body 40 of the thermal carrier 12, the CTE mismatch between the ring structure 14 and the thermal carrier 12 will be reduced compared to the CTE mismatch between the ring structure 14 and a solid metal carrier.

In some applications, the thermal carrier 12 may only be used as a heat sink, and the carrier vias 44 may be omitted, as illustrated in FIGS. 4A and 4B. In order to further reduce the CTE mismatch and/or enhance the adhesion between the thermal carrier 12 and the ring structure 14, the thermal carrier 12 may further include a solder mask 52 over a periphery of the top coating layer 46, as illustrated in FIG. 4A. The solder mask 52 may be formed from epoxy liquid (conductive or non-conductive). As such, within the air-cavity semiconductor package 10, a bottom surface of the ring body 20 is coupled to the solder mask 52, and there is no metal material between the ring structure 14 (ring body 20) and the thermal carrier 12 (solder mask 52).

In another embodiment, the top coating layer 46 does not fully cover the common top plane, as illustrated in FIG. 4B. The top coating layer 46 is pulled back from edges of the top surface of the thermal carrier 12, such that at least a portion of the carrier body 40 is not covered by the top coating layer 46. In this manner, within the air-cavity semiconductor package 10, the bottom surface of the ring body 20 is coupled to the top surface of the carrier body 40, and there is no metal material between the ring structure 14 (ring body 20) and the thermal carrier 12 (carrier body 40). Herein, there may be a glue, which may be formed of conductive or non-conductive epoxy, between the ring structure 14 (ring body 20) and the thermal carrier 12 (carrier body 40) to enhance adhesion (not shown).

In some applications, the thermal carrier 12 may not include the heat slug embedded in the carrier body 40. Instead, the thermal carrier 12 may include a heat slug 42', which is plated within the carrier body 40. As illustrated in FIG. 5A, the heat slug 42' is surrounded by the carrier body 40 and vertically aligned with the interior opening 22 of the ring structure 14 (not shown). The top surface of the carrier body 40 and a top surface of the heat slug 42' are in the common top plane, while the bottom surface of the carrier body 40 and a bottom surface of the heat slug 42' are in the common bottom plane. Compared to the embedded heat slug 42, the plated heat slug 42' is not formed from Cu/Mo/Cu laminates and is not coupled to the carrier body 40 via the glue material 50. Instead, the heat slug 42' is directly in contact with the carrier body 40. It is because the plated heat slug 42' is formed by a plating process directly on interior surfaces of the carrier body 40. The heat slug 42' may be formed of copper, a copper alloy composite, or a thermally conductive ceramic. The top coating layer 46 is formed over the common top plane, fully covers the top surface of the carrier body 40 and the top surface of the heat slug 42', and is in contact with the carrier body 40 and the heat slug 42'. The bottom coating layer 48 is formed underneath the common bottom plane, fully covers the bottom surface of the carrier body 40 and the bottom surface of the heat slug 42', and is in contact with the carrier body 40 and the heat slug 42'. Each carrier via 44 extends vertically through the carrier body 40 and is electrically coupled to both the top coating layer 46 and the bottom coating layer 48. Note that the heat slug 42', the carrier vias 44, the top coating layer 46, and the bottom coating layer 48 may be formed by a same plating process with a same conductive material.

FIGS. 5B and 5C provide alternative thermal carriers 12 with the plated heat slug 42', while the carrier vias 44 are omitted. In FIG. 5B, the thermal carrier 12 further includes the solder mask 52 over the periphery of the top coating layer 46. As such, within the air-cavity semiconductor package 10, the bottom surface of the ring body 20 is coupled to the solder mask 52, and there is no metal material between the ring structure 14 (ring body 20) and the thermal carrier 12 (solder mask 52). In FIG. 5C, the top coating layer 46 does not fully cover the common top plane. Instead, the top coating layer 46 is pulled back from edges of the top surface of the thermal carrier 12, such that at least a portion of the carrier body 40 is not covered by the top coating layer 46. In this manner, within the air-cavity semiconductor package 10, the bottom surface of the ring body 20 is coupled to the top surface of the carrier body 40, and there is no metal material between the ring structure 14 (ring body 20) and the thermal carrier 12 (carrier body 40). Herein, there may be a glue, which may be formed of conductive or non-conductive epoxy, between the ring structure 14 (ring body 20) and the thermal carrier 12 (carrier body 40) to enhance adhesion (not shown).

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a thermal carrier comprising a carrier body, a heat slug, a top coating layer, and a bottom coating layer, wherein:
   the heat slug resides in the carrier body and is surrounded by the carrier body;
   the top coating layer fully covers a top surface of the heat slug, and partially covers a top surface of the carrier body, such that periphery portions of the top surface of the carrier body are not covered by the top coating layer; and
   the bottom coating layer is formed underneath a bottom surface of the carrier body and a bottom surface of the heat slug;
   a ring structure residing over the thermal carrier and comprising a ring body with an interior opening, wherein:

a bottom surface of the ring body is coupled to the uncovered periphery portions of the top surface of the carrier body;

a portion of the top surface of the thermal carrier is exposed through the interior opening of the ring body; and the heat slug within the thermal carrier is aligned vertically with the interior opening of the ring body;

a package lid residing on the ring structure and having a recess conjoined with the interior opening of the ring body to form an enclosed cavity; and at least one semiconductor device attached to the exposed portion of the top surface of the thermal carrier and encapsulated in the enclosed cavity.

2. The apparatus of claim 1 wherein the heat slug, the top coating layer, and the bottom coating layer are formed of copper.

3. The apparatus of claim 2 wherein the heat slug is in contact with interior surfaces of the carrier body.

4. The apparatus of claim 1 wherein:

the heat slug is formed of sandwiched copper-molybdenum-copper laminates; and the top coating layer and the bottom coating layer are formed of copper.

5. The apparatus of claim 4 wherein the heat slug is coupled to interior surfaces of the carrier body via a glue material.

6. The apparatus of claim 1 wherein the top coating layer has a density between 0.5 oz/μm² and 2 oz/μm², and the bottom coating layer has a density between 0.5 oz/μm² and 2 oz/μm².

7. The apparatus of claim 1 wherein the carrier body and ring body are formed from a same organic laminate material.

8. The apparatus of claim 1 wherein the carrier body and ring body are formed from different organic laminate materials.

9. The apparatus of claim 1 wherein:

the top surface of the carrier body and the top surface of the heat slug are in a common top plane, while the bottom surface of the carrier body and the bottom surface of the heat slug are in a common bottom plane;

the bottom coating layer fully covers the bottom surface of the carrier body and the bottom surface of the heat slug; and the top coating layer is directly in contact with the top surface of the heat slug.

10. The apparatus of claim 1 wherein the ring structure further includes a plurality of interconnect tabs and a plurality of contact layers, wherein:

the plurality of interconnect tabs are separate from each other, and the plurality of contact layers are separate from each other;

each of the plurality of interconnect tabs includes a tab body and a plating layer, wherein:

the tab body extends outward from an outer periphery of the ring body;

the plating layer covers at least a portion of a top surface of the tab body and at least a portion of a bottom surface of the tab body; and a portion of the plating layer over the top surface of the tab body and a portion of the plating layer over the bottom surface of the tab body are electrically coupled;

the plating layer is connected to a corresponding contact layer and is separate from the thermal carrier;

the package lid is coupled to the plurality of contact layers; and a portion of each of the plurality of contact layers is exposed to the enclosed cavity.

11. The apparatus of claim 10 wherein the ring body and the tab body are formed from a same organic laminate material.

12. The apparatus of claim 10 wherein the plating layer covers at least one side surface of the tab body.

13. The apparatus of claim 10 wherein each of the plurality of interconnect tabs further comprises a plurality of plated vias that electrically couple the portion of the plating layer over the top surface of the tab body and the portion of the plating layer over the bottom surface of the tab body.

14. The apparatus of claim 1 wherein the ring structure further includes a plurality of interconnect tabs and a plurality of contact layers, wherein:

the plurality of interconnect tabs are separate from each other, and the plurality of contact layers are separate from each other;

each of the plurality of interconnect tabs is formed of a solid conductive material and extends outward from an outer periphery of the ring body, each of plurality of interconnect tabs is connected to a corresponding contact layer and is separate from the thermal carrier;

the package lid is coupled to the plurality of contact layers; and a portion of each of the plurality of contact layers is exposed to the enclosed cavity.

15. The apparatus of claim 1 wherein the thermal carrier has a thickness between 10 mil and 60 mil, and the ring structure has a thickness between 5 mil and 25 mil.

16. An apparatus comprising:

a thermal carrier comprising a carrier body, a heat slug, a top coating layer, a bottom coating layer, and a plurality of carrier vias, wherein:

the heat slug resides in the carrier body and is surrounded by the carrier body;

the top coating layer fully covers a top surface of the carrier body and a top surface of the heat slug, and the bottom coating layer fully covers a bottom surface of the carrier body and a bottom surface of the heat slug; and each of the plurality of carrier vias extends vertically through the carrier body and is electrically coupled to both the top coating layer and the bottom coating layer;

a ring structure residing over the thermal carrier and comprising a ring body with an interior opening, wherein:

a portion of the top surface of the thermal carrier is exposed through the interior opening of the ring body; and the heat slug within the thermal carrier is aligned vertically with the interior opening of the ring body;

a package lid residing on the ring structure and having a recess conjoined with the interior opening of the ring body to form an enclosed cavity; and at least one semiconductor device attached to the exposed portion of the top surface of the thermal carrier and encapsulated in the enclosed cavity.

17. The apparatus of claim 16 wherein a bottom surface of the ring body is coupled to the top coating layer.

18. The apparatus of claim 16 wherein the plurality of carrier vias reside at opposite sides of the heat slug.

19. The apparatus of claim 16 wherein the plurality of carrier vias surround the heat slug.

20. The apparatus of claim 16 wherein the thermal carrier further includes a solder mask over a periphery of the top coating layer, wherein a bottom surface of the ring body is coupled to the solder mask.

21. The apparatus of claim 16 wherein:
- the top surface of the carrier body and the top surface of the heat slug are in a common top plane, while the bottom surface of the carrier body and the bottom surface of the heat slug are in a common bottom plane; and
- the top coating layer is directly in contact with the top surface of the heat slug, and the bottom coating layer is directly in contact with the bottom surface of the heat slug.

* * * * *